US006940506B2

(12) United States Patent  (10) Patent No.: US 6,940,506 B2
Mashimo  (45) Date of Patent: Sep. 6, 2005

(54) METHOD AND APPARATUS GENERATING ANALYSIS MESH DATA, AND COMPUTER PRODUCT

(75) Inventor: Keiji Mashimo, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 2 days.

(21) Appl. No.: 10/288,372

(22) Filed: Nov. 6, 2002

(65) Prior Publication Data

US 2003/0085892 A1 May 8, 2003

(30) Foreign Application Priority Data

Nov. 7, 2001 (JP) ........................................ 2001-342261

(51) Int. Cl.[7] .............................................. G06T 15/30
(52) U.S. Cl. ...................... 345/423; 345/441; 345/964; 345/965; 345/953
(58) Field of Search ................................ 345/423, 441, 345/964, 965, 953

(56) References Cited

U.S. PATENT DOCUMENTS

| 4,797,842 A | 1/1989 | Nackman et al. |
| 5,497,451 A | 3/1996 | Holmes |
| 5,760,779 A | 6/1998 | Yamashita et al. |
| 6,535,211 B1 * | 3/2003 | Hariya et al. ............... 345/423 |
| 6,704,018 B1 * | 3/2004 | Mori et al. .................. 345/502 |

FOREIGN PATENT DOCUMENTS

| EP | 0 350 578 | 4/1989 |
| JP | 03075970 | 3/1991 |

OTHER PUBLICATIONS

K. Mashimo, et al., "Development of the Simulation Tool for Vehicle Electronic Parts", Society of Automative Engineers, Inc., Mar. 5, 2002, 4 pages.

Keiji Mashimo, et al., "New Approach of Computer Simulation of Heat Transfer in Automotive Parts", Nov. 8, 2001, 6 pages.

* cited by examiner

*Primary Examiner*—Matthew C. Bella
*Assistant Examiner*—Tam Tran
(74) *Attorney, Agent, or Firm*—Oblon, Spivak, McClelland, Maier & Neustadt, P.C.

(57) ABSTRACT

A shape characteristic extractor decomposes and extracts typical shapes where element division is easy from shape data that indicates the shape of an object. An analysis mesh data generator generates analysis mesh data (element dividing information) for each of the decomposed and extracted shapes. Thus, the element dividing information can be generated even if the object has a complicated shape. Moreover, the element dividing information can be generated accurately and speedily.

6 Claims, 3 Drawing Sheets

METHOD AND APPARATUS GENERATING ANALYSIS MESH DATA, AND COMPUTER PRODUCT

BACKGROUND OF THE INVENTION

1) Field of the Invention

The present invention relates to a technology for generating analysis mesh data.

2) Description of the Related Art

There is an increasing demand that the electric products be light and compact. To fulfill this demand, each part in the electric products should be made light and compact, moreover, the integration between the parts should be a increased.

An improvement in the integration causes an increase of calorific density because of generation of heat in the parts of an electric product. Therefore, when designing the electric product, an analysis of the temperature distribution in the electric product is performed assuming that the electric product is actually functioning.

Reliability of the electric product depends on dynamic factors such as vibrations. Therefore, a dynamic analysis including a vibration analysis of the electric product is as important as the analysis of the temperature distribution (heat analysis).

Heat or vibration analysis is generally performed by numerical analysis such as the finite element method. Softwares that simulate the numerical analysis (numerical analysis simulation softwares) are available. Most of these softwares include three programs: a preprocessor, a solver, and a post-processor. The finite element method is generally carried out according to the following procedure:

(1) generation of input data and conditional equation, (2) execution of analysis program, and (3) output of calculated result.

This procedure will be explained in detail below.

(1) The preprocessor or a text editor generates an input data such as analysis mesh data, position data and boundary conditions. Here, analysis mesh data are such that a shape of an object to be analyzed is divided into small portions called as elements and the elements are jointed at points of contact and a whole model can be constructed. Moreover, position data are pieces of position information (coordinate values) set by numbering the elements and the points of contact. Furthermore, a known quantity of the elements, the points of contact or element surfaces is set as the boundary condition. Furthermore, a conditional equation representing characteristics in the elements is generated. Finally, a simulation model is generated.

The preprocessor normally inputs CAD (Computer Aided Design) data representing a shape of an object to be analyzed. The preprocessor analyzes the CAD data, automatically divides the shape into elements, and extracts the analysis mesh data and position data.

(2) The solver solves the simultaneous equations composed of the conditional equations, which have a quantity of the elements and the points of contact has variables.

(3) The post-processor puts the results, which is, for example, the temperature distribution, into visual form and outputs the results.

However, in the numerical analysis simulation software, when an object to be analyzed has a complicated shape, namely, input data (shape data such as CAD data or position data) are complicated multifariously, it is extremely difficult for the preprocessor to generate analysis mesh data accurately from the input data. At the present, although an object to be measured which is larger than that of the conventional one can be handled due to heightening of a speed and a performance of a computer, there arise problems that it is still complicated to automatically divide a construct having fine gaps, and a lot of time is required for rejig or the like and such a construct is difficultly a suitable model.

Particularly an electric product to be provided to end consumer is in a state that a plurality of parts are integrated highly, and has a lot of fine gaps and scattering in shape and size of the parts. For example, particularly as for a circuit board where a plurality of semiconductor elements and ICs are mounted and a junction block where wire harnesses are connected so that a relay, a fuse or the like is integrated, respective parts generate high heat and the entire product shows complicated temperature distribution. Moreover, there are a lot of cases that breakage occurs due to vibration in an on-vehicle application. Namely, in such a product, a breakage or a failure easily occurs due to heat generation or vibration, and thus heat analysis or vibration analysis become more important.

SUMMARY OF THE INVENTION

It is an object of the present invention to provide a technique with which it is possible to generate coordinates and an analysis mesh data required for numerical analysis even if an object to be analyzed has a complicated shape. Particularly, it is an object of the present invention to provide a method of and an apparatus for generating analysis mesh data, and a computer program that makes it possible to realize the method according to the present invention on a computer.

The analysis mesh data generating apparatus according to one aspect of the present invention generates analysis mesh data required for element division in a numerical analysis. The analysis mesh data includes at least shape data that indicates the shape of an object. This analysis mesh data generating apparatus includes a shape characteristic extracting unit that extracts data representing predetermined characteristics shape from the shape data of the object, and an analysis mesh data generating unit that specifies different pieces of structure information according to shapes represented by the data extracted by the shape characteristic extracting unit, and combines the specified pieces of structure information so as to generate the analysis mesh data.

The analysis mesh data generating method according to still another aspect of the present invention is a method of generating analysis mesh data required for element division in a numerical analysis. The analysis mesh data includes at least shape data that indicates the shape of an object. This analysis mesh data generating method includes extracting data representing predetermined characteristic shapes from the shape data of the object, and specifying different pieces of structure information according to the shapes represented by the data extracted at the extracting step, and combining the specified pieces of structure information so as to generate the analysis mesh data.

The computer program according to still another aspect of the present invention realizes the analysis mesh data generating method on a computer.

These and other objects, features and advantages of the present invention are specifically set forth in or will become apparent from the following detailed descriptions of the invention when read in conjunction with the accompanying drawings.

DETAILED DESCRIPTIONS

An embodiment of the method, the apparatus, and the computer program according to the present invention is explained below with reference to the accompanying drawings.

Figure 1:
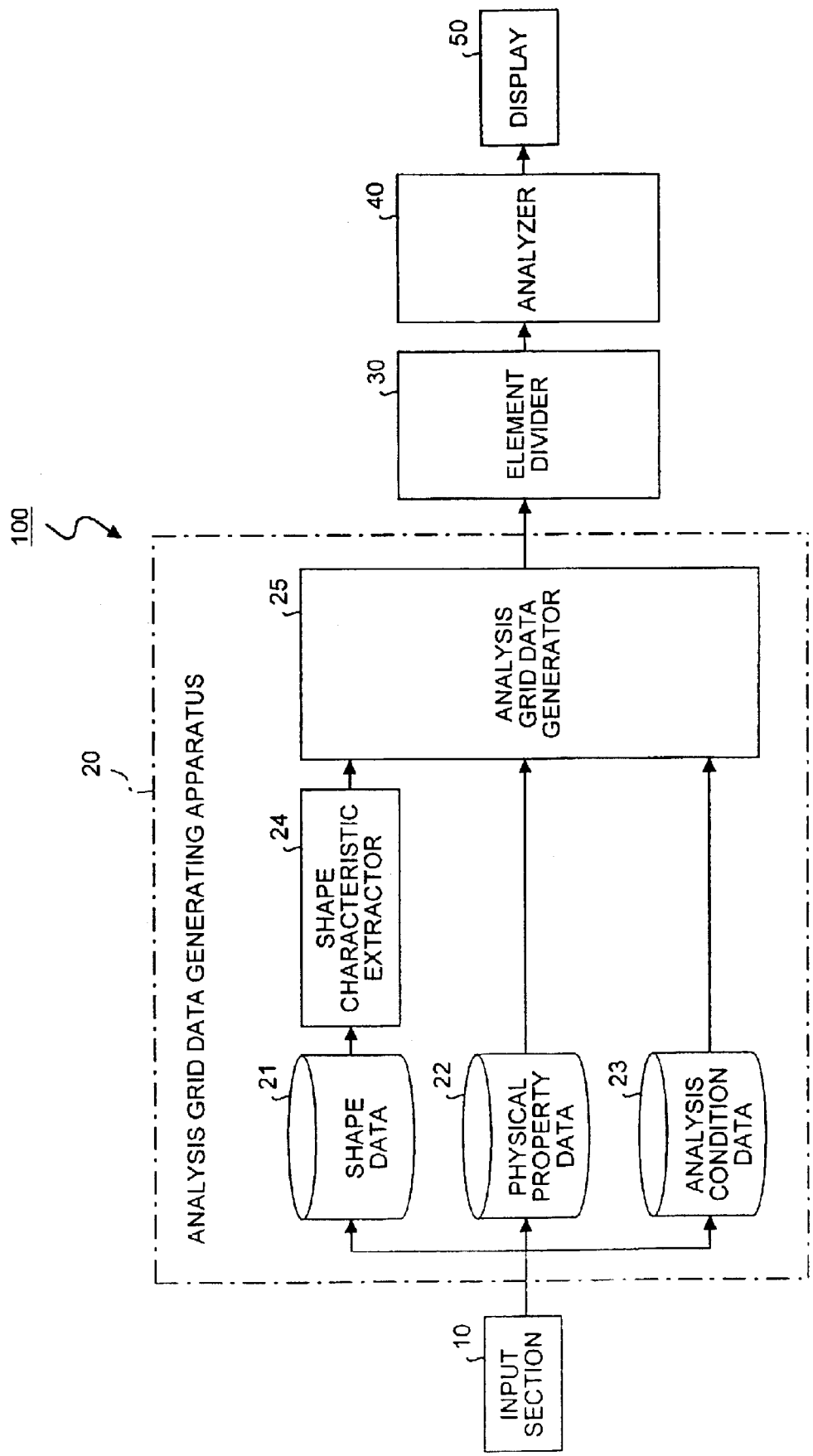
FIG. 1 is a block diagram that shows a schematic structure of an analysis apparatus including an analysis mesh data generating apparatus according to an embodiment.

FIG. 1 is a block diagram that shows a schematic structure of an analysis apparatus including an analysis mesh data generating apparatus according to an embodiment of the present invention. An analysis apparatus 100 shown in FIG. 1 is composed of an input section 10, an analysis mesh data generating apparatus 20, an element divider 30, an analyzer 40, and a display 50.

The input section 10 is for inputting various parameters and/or instructions for execution of the heat analysis of an object to the analysis mesh data generating apparatus 20. Particularly the input section 10 inputs shape data, physical property data, and analysis condition data. The input section 10 is, for example, a keyboard or a pointing device or a combination of these two.

The analysis mesh data generating apparatus 20 includes a shape database 21, a physical property database, an analysis condition database 23, a characteristic extractor 24, and an analysis mesh data generator 25.

The shape database 21 stores the shape data for specifying a shape of an object to be analyzed. The shape data is, for example, CAD data including all apex coordinates of a curved line group and position information in an z-axial direction for each closed curve. The physical property database 22 stores the physical property data that are pieces of physical property information such as a material composing an object to be analyzed, its thermal conductivity, its specific heat and its elastic constant. The analysis condition database 23 stores the analysis condition data that are boundary conditions, element dividing level (dividing pitch), and the like.

The shape characteristic extractor 24 judges as to whether i) the object can be divided into predetermined characteristic shapes (e.g., cube, cuboid, cylinder) from the shape data stored in the shape database 21, or ii) whether the object includes some parts having such characteristic shapes. If the judgement is positive, the shape characteristic extractor 24 extracts shape data of the shapes. If the extraction of the characteristic shapes is impossible, the shape characteristic extractor 24 may include a means that enables manual specification of characteristic shapes according to visual inspection or empirical knowledge of an operator.

If the shape characteristic extractor 24 has extracted the shape characteristics, it supplies the extracted shape data and shape data other than the shape characteristics from the shape database 21 to the analysis mesh data generator 25. If the shape characteristic extractor 24 has failed in the extraction of the shape characteristics, it supplies only the shape data from the shape database 21 to the analysis mesh data generator 25.

The analysis mesh data generator 25 also receives the physical property data from the physical property database 22 and the analysis condition data from the analysis condition database 23. The analysis mesh data generator 25 generates analysis mesh data that are necessary in the element divider 30 from the received data. The analysis mesh data are composed of intercardinal coordinates (coordinates of corners and recession points of an object), a number of layers of the characteristic shapes and their thickness, the dividing pitch, physical property information, and the like.

The element divider 30 divides the shape of the object into a plurality of elements required for finite element analysis based on the analysis mesh data generated by the analysis mesh data generator 25. Precisely, the element divider 30 sustains one function of the preprocessor of the numerical analysis simulation software. Thus, the element divider 30 generates the data (contact point coordinates, connecting information of points of contact composing the elements, physical property information, and the like) necessary in the analyzer 40. The element divider 30 has been shown as separate unit, nevertheless, it may be included in the analysis mesh data generating apparatus 20 as well.

The analyzer 40 makes an analysis based on the data generated by the element divider 30, and sustains the functions of the solver and the post-processor of the numerical analysis simulation software. The display 50 displays the result of the analysis output by the analyzer 40 in a specified display form. The display 50 is, for example, a cathode ray tube or a liquid crystal display.

The analyzer 100 and/or the analysis mesh data generating apparatus 20 shown in FIG. 1 can be realized using a known general-purpose compute. In this case, the respective operations of the shape characteristic extractor 24, the analysis mesh data generator 25, the element divider 30, and the analyzer 40 are realized by computer programs executed on the central processing unit of the computer. The shape database 21, the physical property database 22, and the analysis condition database 23 may be realized in the memory of the computer.

Figure 2:
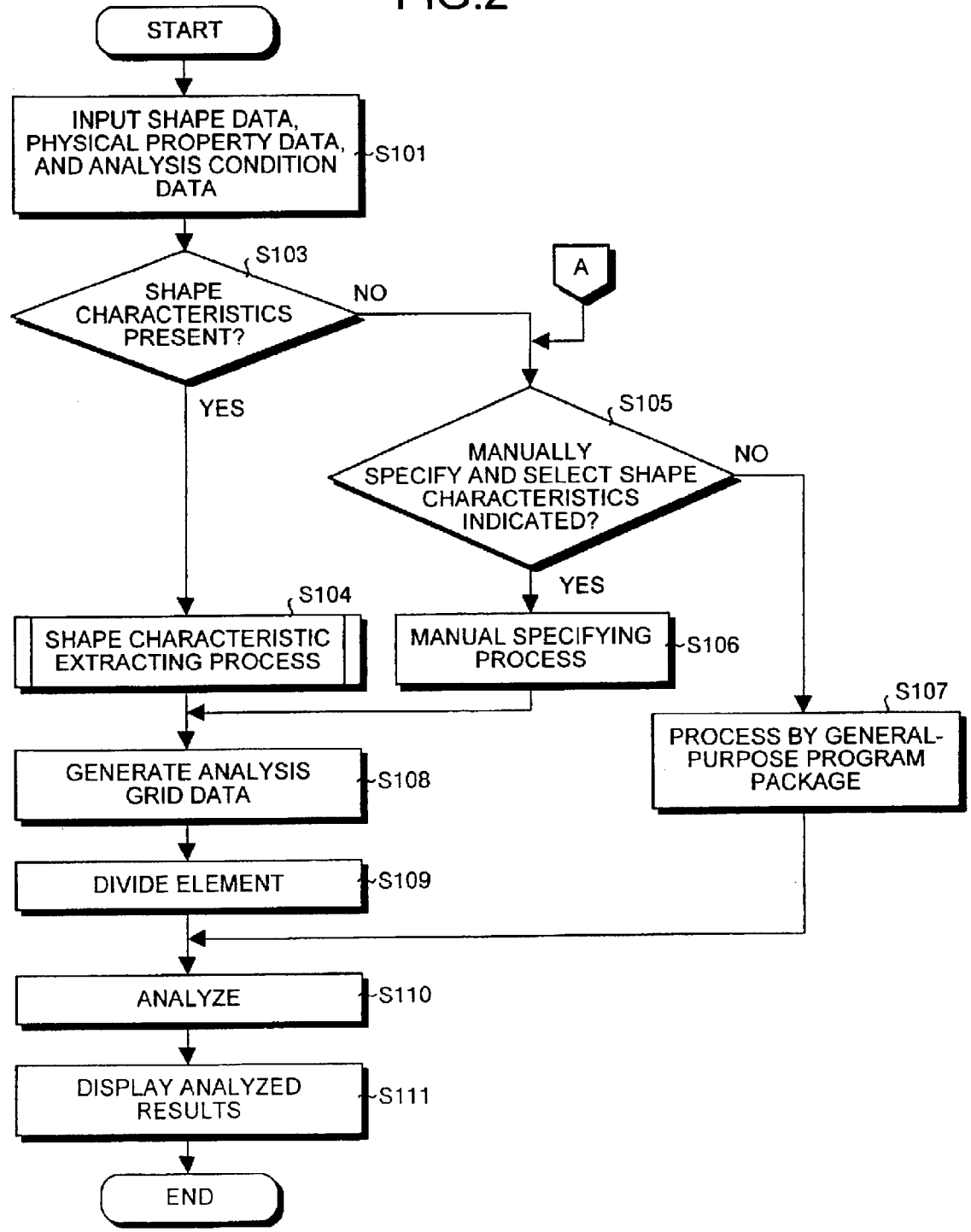
FIG. 2 is a flowchart that explains an operation of the analysis apparatus.

The operation of this analysis apparatus, particularly the operation of the analysis mesh data generating device, namely, the analysis mesh data generating method, will now be explained. FIG. 2 is a flowchart that explains the operation of the analysis apparatus. The input section 10 inputs the shape data, the physical property data, and the analysis condition data (step S101). It should be noted that, these data could be read from CAD data file.

The shape characteristic extractor 24 in the analysis mesh data generating apparatus 20 judges whether the shape data include data representing predetermined shape characteristics (step S103). If the shape characteristics are present, then the shape characteristic extracting process (step S104) is executed. The shape characteristic extracting process will be explained in detail later.

If the shape characteristics are not present, a judgment is made as to whether it is indicated that the shape characteristics will be specified manually by an operator. If manual specification of the shape characteristics is indicated, a manual specifying process is executed (step S106). If manual specification of the shape characteristics is not indicated, a process by means of the general-purpose program package is executed (S107).

The analysis mesh data generator 25 generates the analysis mesh data from the shape data received from the shape characteristic extractor 24, the physical property data and the analysis condition data obtained at step S101 (step S108). The element divider 30 executes element division based on the analysis mesh data generated by the analysis mesh data generator 25, and outputs element dividing information such as contact point coordinates or the like (step S109).

The analyzer 40 makes an analysis, for example, calculates the temperature distribution, based on the element dividing information obtained by the element divider 30 (step S100). The display 50 displays result of the analysis made by the analyzer 40 (step S111).

Figure 3:
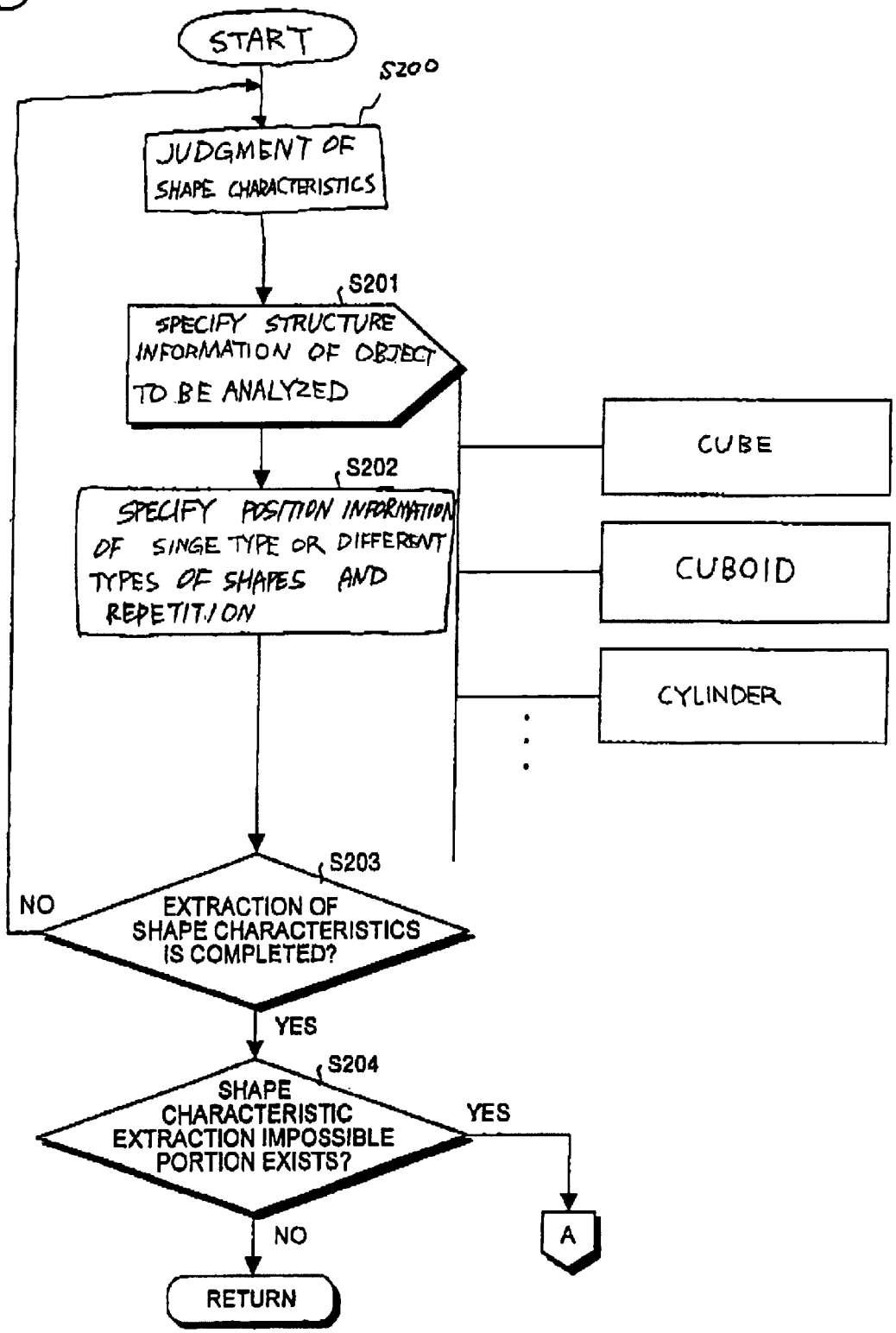
FIG. 3 is a flowchart that shows a shape characteristic extracting process.

FIG. 3 is a flowchart that shows the shape characteristic extracting process (see steps S104 in FIG. 2). If the shape characteristics are present, the shape data representing the respective shape characteristics are extracted, and a judgment is made as to the extracted shape data coincide with which kind of shape structure information (steps S200 and S201). For example, if the extracted shape data represent a cube, element dividing definition of the cube previously prepared is used so as to generate element dividing information such as intercardinal point coordinates of the cube.

As to whether a plurality of shapes are arranged like the layer structure, namely, repeated shapes exist is found from the shape data input at step S101, and their position information and a number of repetition are specified (step S202). When the element dividing information is generated repeatedly for all the detected shape characteristics (step S203: NO) and extraction of all the shape characteristics and the generation of the element dividing information is completed (step S203: YES), a judgment is made as to whether a portion which is not extracted as a characteristic shape and remains exists. When the remained portion exists (step S204: YES), the sequence returns to step S105. When the remained portion does not exist (step S104: NO), the system control return to the step S108.

In other words, the shape characteristic extracting process is a program for converting from CAD data into a numerical analysis mesh, and its logical structure is such that the process is branched by the shape characteristics of an object to be analyzed. Namely, when a cuboid structure, for example, handles a dominant object as mentioned above, the process jumps to a cuboid structure processing routine, and when a combination of cylinders is dominant, the process jumps to a cylindrical structure processing routine. If an object is composed of combinations of the basic structures and the repetition of the basic structure, the program structure easily comply with the object.

As explained above, according to the analysis mesh data generating apparatus and the analysis mesh data generating method according to the present embodiment, even if an object to be analyzed has a complicated shape, easy typical shapes are decomposed and extracted by the element division and element dividing information is generated for each of the decomposed and extracted shapes. As a result, except for an object that does not have structural characteristics at all and symmetry, analysis mesh data can be given to the element divider 30 (solver) by exceptionally easier procedure than the conventional one. Since particularly most industrial products have structural characteristics and symmetry, a substantially large effect that can be obtained by the present invention is expected.

In the embodiment, when the operations of the shape characteristic extractor 24, the analysis mesh data generator 25, the element divider 30, and the analyzer 40 are realized by a computer program, the computer program can be executed by the following various forms.

Firstly, a recording medium such as a CD-ROM and a memory card on which the program has been stored is read in a computer system to be the analysis apparatus or the analysis mesh data generating apparatus, and the program is executed directly or is installed to be executed.

Secondly, the computer system to be the analysis apparatus or the analysis mesh data generating apparatus downloads the program from another apparatus such as a WWW (World Wide Web) server or an FTP (File Transfer Protocol) server via a communication line of an internet or the like. Thereafter, the computer system installs and executes the program.

Thirdly, a terminal device such as a personal computer accesses to an ASP (Application Service Provider) server, and executes the program on the ASP server so as to get the same service as that in the analysis mesh data generating method.

As explained above, according to the analysis mesh data generating apparatus and the analysis mesh data generating method of the present invention, an typical shape where element division is easy is decomposed and extracted from shape data of an object to be analyzed and element dividing information for each of the decomposed and extracted shapes is generated. For this reason, even when an object to be analyzed has a complicated shape, analysis mesh data to be given to the element dividing step can be generated by an easy procedure.

According to the program of the present invention, since the analysis mesh generating method can be executed by a computer, the method can be executed on the computer by a recording medium on which the program has been recorded or downloading via a communication line.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. An analysis mesh data generating apparatus that generates analysis mesh data required for element division in a numerical analysis, said analysis mesh data including at least shape data that indicates the a shape of an object, the apparatus comprising:

a shape characteristic extracting unit configured to determine whether the shape of the object is divisible such that a portion of the shape is characterized into a predetermined shape classification, and another portion is not, from the shape data of the object; and then determine structure information of the object according with the predetermined shape classification in addition to additional shape data that describes the another portion; and an analysis mesh data generating unit that combines the structure information determined by the shape characteristic extracting unit so as to generate the analysis mesh data.

2. The analysis mesh data generating apparatus according to claim 1, wherein when the shape of the object includes a plurality of single shape features or plural different shape features, the analysis mesh data generating unit measures a number of repetition and the position data of the single shape features or numbers of repetition and the position data of the different shape features to be included in the analysis mesh data.

3. An analysis mesh data generating method of generating analysis mesh data required for element division in a numerical analysis, said analysis mesh data including at least shape data that indicates a shape of an object, the method comprising:

extracting data representing predetermined characteristic shapes from a subset of the shape data of the object; and a shape characteristic extracting step which includes a shape characteristic measuring step that determines whether the shape of the object is divisible such that a portion of the shape is characterized into a predetermined shape classification, and another portion is not, and then determines the structure information of the object according with the predetermined shape classification in addition to additional shape data that describes the another portion; and an analysis mesh data generating step that combines the structure information determined in the shape characteristic extracting step so as to generate the analysis mesh data.

4. The analysis mesh data generating method according to claim 3, wherein when the shape of the object includes a plurality of single shape features or plural different shape features, a number of repetition and the position data of the single shape feature or numbers of repetition and the position data of the different shape features, which are measured in the analysis mesh data generating step, are included in the analysis mesh data.

5. A computer program for generating analysis mesh data required for element division in a numerical analysis, analysis mesh data including at least shape data that indicates the shape of an object makes a computer execute:

extracting data representing predetermined characteristic shapes from the shape data of the object; and a shape characteristic extracting step which includes a shape characteristic measuring step that determines whether the shape of the object is divisible such that a portion of the shape is characterized into a predetermined shape classification, and another portion is not, and then determines the structure information of the object according with the predetermined shape classification in addition to additional shape data that describes the another portion; and an analysis mesh data generating step that combines the structure information determined in the shape characteristic extracting step so as to generate the analysis mesh data.

6. The program according to claim 5, wherein when the shape of the object includes a plurality of single shape features or plural different shape features, a number of repetition and the position data of the single shape feature or numbers of repetition and the position data of the different shape features, which are measured in the analysis mesh data generating step, are included in the analysis mesh data.

* * * * *